United States Patent
Lin et al.

(10) Patent No.: US 9,123,870 B2
(45) Date of Patent: Sep. 1, 2015

(54) LED PACKAGE STRUCTURE

(75) Inventors: Hsin-Chiang Lin, Hsinchu (TW); Chieh-Ling Chang, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 420 days.

(21) Appl. No.: 13/325,010

(22) Filed: Dec. 13, 2011

(65) Prior Publication Data

US 2012/0273819 A1    Nov. 1, 2012

(30) Foreign Application Priority Data

Apr. 29, 2011   (CN) .......................... 2011 1 0110696

(51) Int. Cl.
 *H01L 33/00*   (2010.01)
 *H01L 33/48*   (2010.01)
 *H01L 33/54*   (2010.01)
 *H01L 33/62*   (2010.01)

(52) U.S. Cl.
 CPC .............. *H01L 33/486* (2013.01); *H01L 33/54* (2013.01); *H01L 33/62* (2013.01); *H01L 2224/48247* (2013.01); *H01L 2924/01322* (2013.01)

(58) Field of Classification Search
 CPC ......... H01L 33/36; H01L 33/37; H01L 33/38; H01L 21/56; H01L 23/10; H01L 23/48; H01L 33/486; H01L 33/54
 USPC .............................................. 257/98, 99, 100
 See application file for complete search history.

(56) References Cited

U.S. PATENT DOCUMENTS

| | | | |
|---|---|---|---|
| 7,923,271 B1 | 4/2011 | Hwu et al. | |
| 2004/0159850 A1* | 8/2004 | Takenaka | 257/98 |
| 2008/0224161 A1* | 9/2008 | Takada | 257/98 |
| 2009/0134408 A1* | 5/2009 | Park et al. | 257/88 |
| 2009/0154176 A1* | 6/2009 | Matsuoka et al. | 362/382 |
| 2010/0123156 A1* | 5/2010 | Seo et al. | 257/99 |
| 2010/0181582 A1 | 7/2010 | Li et al. | |
| 2011/0233571 A1* | 9/2011 | Park | 257/88 |
| 2012/0228546 A1* | 9/2012 | Sunkara | 252/183.11 |
| 2012/0313131 A1* | 12/2012 | Oda et al. | 257/98 |

FOREIGN PATENT DOCUMENTS

| | | | | |
|---|---|---|---|---|
| CN | 1523681 A | | 8/2004 | |
| CN | 101777549 A | | 7/2010 | |
| JP | 2010-135729 | * | 6/2010 | ............ H01L 33/60 |
| TW | M397034 U | | 1/2011 | |
| TW | 201112454 A1 | | 4/2011 | |
| WO | WO 2011/030746 | * | 3/2011 | ............ H01L 33/60 |
| WO | WO 2011/122665 | * | 10/2011 | ............ H01L 33/62 |

* cited by examiner

*Primary Examiner* — Benjamin Sandvik
*Assistant Examiner* — Farid Khan
(74) *Attorney, Agent, or Firm* — Novak Druce Connolly Bove + Quigg LLP

(57) ABSTRACT

An LED package structure includes a substrate, two electrodes engaged in the substrate, an LED chip, a reflective cup and an encapsulation. The substrate includes a first surface and a second surface opposite to the first surface. Each of the electrodes defines a groove. The grooves surrounding the LED chip. The LED chip is mounted on one of the electrodes and electrically connected to the two electrodes. The reflective cup is mounted on the substrate and surrounds the LED chip. The encapsulation covers the LED chip and extends in the grooves of the electrodes to prevent water/moisture from entering the LED chip.

9 Claims, 4 Drawing Sheets

LED PACKAGE STRUCTURE

BACKGROUND

1. Technical Field

The present disclosure relates to semiconductor packages and, particularly, to an LED (light emitting diode) package structure.

2. Description of Related Art

Light emitting diodes (LEDs) have many beneficial characteristics, including low electrical power consumption, low heat generation, long lifetime, small volume, good impact resistance, fast response and excellent stability. These characteristics have made the LEDs widely used in illuminating lamps or light sources of liquid crystal displays or other applications. Typically, an LED package structure includes an insulator and two electrodes inserted in the insulator; the insulator is usually made of plastic material, and the electrodes are usually made of metal; it is difficult for the electrodes to completely tightly engage with the plastic material; as a result, water/moisture can enter the LED package structure through a gap between the insulator and the electrodes, thereby decreasing the lifetime of the LED package structure.

What is needed is an LED package structure which can overcome the limitations described.

DETAILED DESCRIPTION

Embodiments of the disclosure will now be described in detail with reference to the accompanying drawings.

Figure 1:
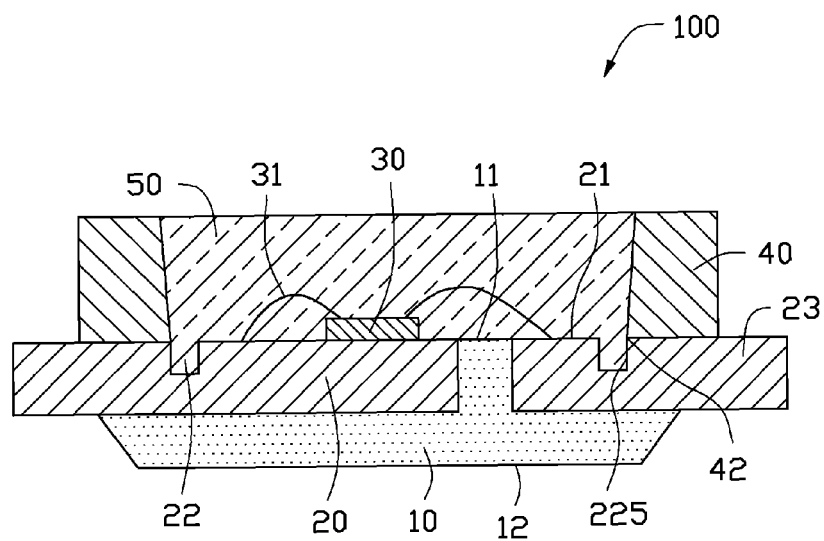
FIG. 1 is a cross-sectional view of an LED package structure according to a first embodiment of the present disclosure.
Figure 2:
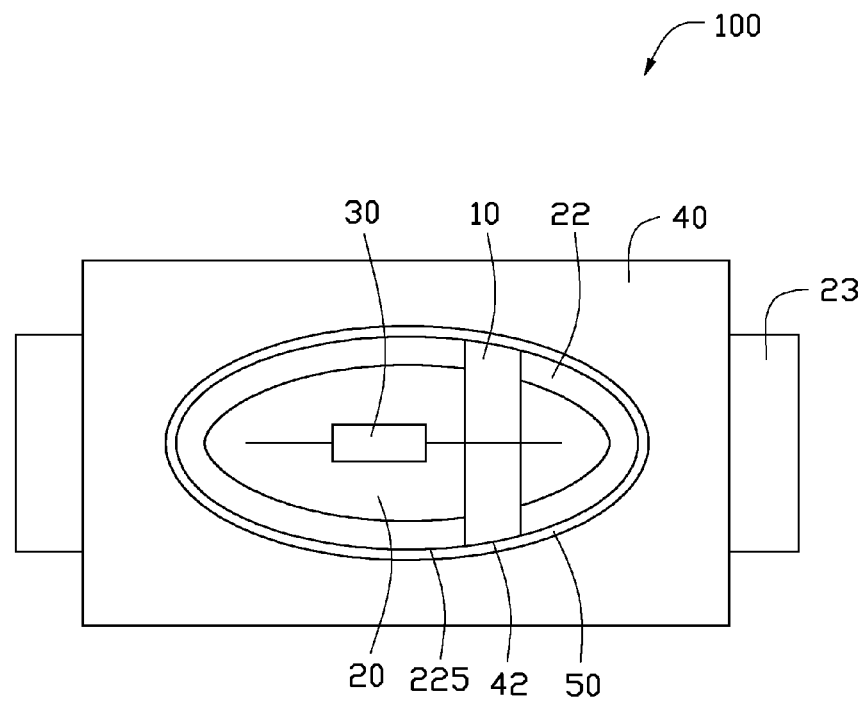
FIG. 2 is a top view of the LED package structure of FIG. 1.

Referring to FIG. 1, an LED package structure 100 in accordance with a first embodiment of the disclosure is illustrated. The LED package structure 100 includes a substrate 10, two electrodes 20, an LED chip 30, a reflective cup 40, and an encapsulation 50.

The substrate 10 has a first surface 11 and a second surface 12 opposite to the first surface 11. The substrate 10 can be made of epoxy, silicone, silicon oxide or a mixture thereof. Preferably, the substrate 10 is made of thermally conductive and electrically insulating material.

Each of the electrodes 20 is formed on the substrate 10 and electrically insulated from each other. The electrodes 20 can be made of metal such as copper (Cu), nickel (Ni), silver (Ag), aluminum (Al), tin (Sn), gold (Au) or an alloy thereof, or made of oxides such as indium tin oxide (ITO). Each of the electrodes 20 has a rectangular shape in cross section. Each of the electrodes 20 has a top surface 21 parallel to and coplanar with the first surface 11 of the substrate 10, and a bottom surface embedded in the substrate 10. Each electrode 20 has a contact end 23 and an opposite inner end. The inner ends of the electrodes 20 are located within the reflective cup 40. The contact ends 23 of the electrodes 20 are exposed from lateral sides of the reflective cup 40 for electrically connecting with an external circuit in connection with an external power source. Each of the electrodes 20 defined a groove 22 at the top surface 21 thereof between the inner end and the contact end 23. Each of the grooves 22 has an arched shape. The grooves 22 together surround the LED chip 30. The electrodes 20 together form an elliptical configuration and the grooves 22 together form an elliptical loop, as viewed from a top of the LED package structure 100. Each of the grooves 22 has an inner edge adjacent to the LED chip 30 and an outer edge 225 spaced from the inner edge and away from the LED chip 30.

The LED chip 30 is mounted on one electrode 20, and is electrically connected to the two electrodes 20 by two metallic wires 31 through wire bonding. Alternatively, the LED chip 30 can be electrically connected to the electrodes 20 by flip-chip bonding or eutectic bonding.

The reflective cup 40 is disposed on the substrate 10 and surrounds the LED chip 30. The reflective cup 40 is configured for reflecting the light irradiating thereon to improve the amount of the light emitted out of the LED package 100. The reflective cup 40 can be made of a light reflective material completely, or only has an inner surface thereof coated with a light reflective material. Preferably, the reflective cup 40 is made of thermally conductive and electrically insulating material. The reflective cup 40 can be integrally formed with the substrate 10 as a single piece. An inner wall of the reflective cup 40 gradually expands along a direction away from the substrate 10. In other words, a bore size of the reflective cup 40 at a top thereof is larger than that at a bottom thereof. A bottom edge 42 of the inner wall of the reflective cup 40 is located adjacent to the outer edges 225 of the grooves 22.

The encapsulation 50 is filled in the reflective cup 40 and covers the LED chip 30 for protecting the LED chip 30 from dust, water, moisture or other foreign articles. The encapsulation 50 can be made of silicone, epoxy, or a mixture thereof. Preferably, the encapsulation 50 further includes fluorescent powder, such as YAG, TAG, silicate, nitride, nitrogen oxides, phosphide or sulfide. The fluorescent powder is used for changing color of light from the LED chip 30 into a different color. The encapsulation 50 further is filled in the grooves 22 of the electrodes 20.

In the LED package 100, because the grooves 22 of the electrodes 20 are filled with the encapsulation 50, the contacting area between the encapsulation 50 and the electrodes 20 is increased; thus, there is a relatively large engagement strength between the encapsulation 50 and the electrodes 20, and accordingly, there will be a smaller gap or no gap between the encapsulation 50 and the electrodes 20; thus, water/moisture is difficult to enter the LED package 100 from a gap between the encapsulation 50 and the electrodes 20.

Figure 3:
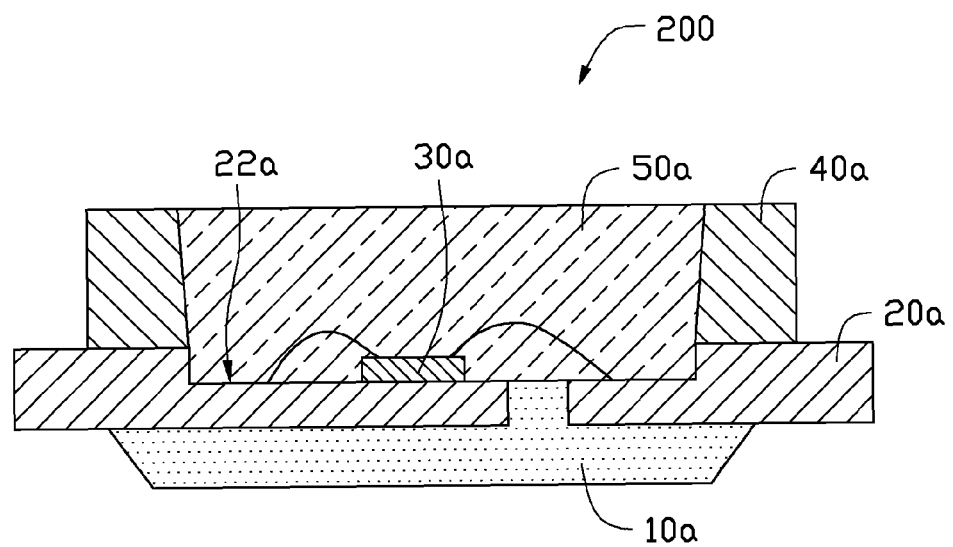
FIG. 3 is a cross-sectional view of an LED package structure according to a second embodiment of the present disclosure.

Referring to FIG. 3, an LED package structure 200 in accordance with a second embodiment includes a substrate 10a, two electrodes 20a, an LED chip 30a, a reflective cup 40a, and an encapsulation 50a. The difference of the LED package structure 200 from the LED package structure 100 of the first embodiment is that a groove 22a of each of the electrodes 20a is defined at whole area of the electrode 20a corresponding to the bottom of the encapsulation 50a. The grooves 22a of the electrodes 20a cooperatively form an ellipse-shaped recess. The LED chip 30a is mounted in the groove 22a of one electrode 20a.

Figure 4:
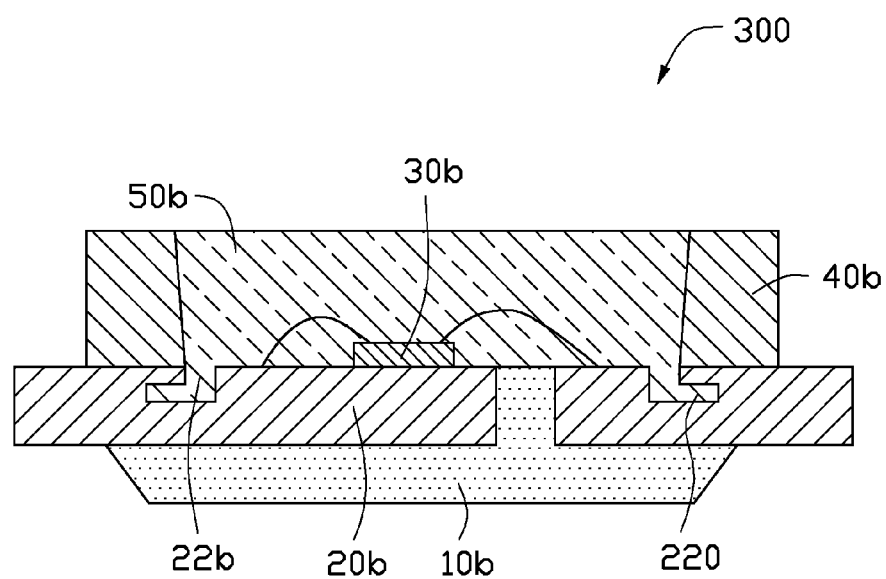
FIG. 4 is a cross-sectional view of an LED package structure according to a third embodiment of the present disclosure.

Referring to FIG. 4, an LED package structure 300 in accordance with a third embodiment includes a substrate 10b, two electrodes 20b, an LED chip 30b, a reflective cup 40b, and an encapsulation 50b. The difference of the LED package structure 300 from the LED package structure 100 of the first embodiment is that a groove 22b of each of the electrodes 20b has a clasping part 220 extending laterally from a bottom of the groove 22b. In other words, each of the grooves 22b has an L-shaped cross-section. In another embodiment, each of the grooves 22b can be defined to have a T-shaped cross-section. Therefore, water/moisture is more difficult to enter the LED package 300 through a gap between the encapsulation 50b and the electrodes 20b.

It is to be understood, however, that even though numerous characteristics and advantages of certain embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An LED package structure comprising:
   a substrate;
   an LED chip;
   two electrodes engaged in the substrate, each of the electrodes having a top even surface, each of the electrodes defining a groove, each of the grooves of the electrodes being arch-shaped, the grooves surrounding the LED chip and recessing from the top even surface downwardly, wherein the LED chip is mounted on one of the electrodes and electrically connects with the two electrodes;
   a reflective cup mounted on the substrate and surrounding the LED chip; and
   an encapsulation covering the LED chip and extending in the grooves of the electrodes to prevent water/moisture from entering the LED chip via a gap between the encapsulation and the electrodes;
   wherein the reflective cup has an inner wall defining a space receiving the LED chip and the encapsulation, the groove has an inner edge near the LED chip and an outer edge away from the LED chip, and a bottom edge of the inner wall connected to the electrodes is located at a position aligned to outer edges of the grooves of the electrodes.

2. The LED package structure of claim 1, wherein the substrate has a top surface, the electrodes are received in the substrate and the top even surface is coplanar with the top surface of the substrate.

3. The LED package structure of claim 1, wherein each of the grooves of the electrodes has an L-shaped cross-section.

4. The LED package structure of claim 1, wherein each of the grooves of the electrodes has a T-shaped cross-section.

5. The LED package structure of claim 1, wherein the encapsulation is made of silicone, epoxy, or a mixture thereof.

6. The LED package structure of claim 5, wherein the encapsulation comprises fluorescent powder, the fluorescent powder comprising YAG, TAG, silicate, nitride, nitrogen oxides, phosphide or sulfide.

7. The LED package structure of claim 1, wherein the electrodes are made of metal or oxide.

8. The LED package structure of claim 7, wherein the electrodes are made of indium tin oxide (ITO), copper (Cu), nickel (Ni), silver (Ag), aluminum (Al), tin (Sn), gold (Au) or an alloy thereof.

9. The LED package structure of claim 1, wherein the two grooves of the electrodes together form a loop-shaped configuration.

* * * * *